(12) United States Patent
Sudou

(10) Patent No.: US 7,417,423 B2
(45) Date of Patent: Aug. 26, 2008

(54) METHOD OF TESTING A MAGNETIC HEAD FOR ELIMINATING DEFECTIVE MAGNETIC HEADS

(75) Inventor: Masatoshi Sudou, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/515,714

(22) Filed: Sep. 6, 2006

(65) Prior Publication Data
US 2007/0296407 A1 Dec. 27, 2007

(30) Foreign Application Priority Data
Jun. 23, 2006 (JP) ............... 2006-173461

(51) Int. Cl.
*G01R 33/12* (2006.01)
(52) U.S. Cl. .................................... 324/210
(58) Field of Classification Search .......... 324/210–212
See application file for complete search history.

(56) References Cited

U.S. PATENT DOCUMENTS

| | | | |
|---|---|---|---|
| 5,134,366 A * | 7/1992 | Kirk ............................ | 324/210 |
| 5,668,477 A * | 9/1997 | Mahmoudian et al. ...... | 324/613 |
| 5,854,554 A * | 12/1998 | Tomita et al. ................ | 324/210 |
| 6,538,430 B2 * | 3/2003 | Carrington et al. .......... | 324/210 |
| 6,738,208 B2 * | 5/2004 | Dakroub ...................... | 360/31 |
| 7,248,039 B2 * | 7/2007 | Green et al. ................. | 324/210 |

FOREIGN PATENT DOCUMENTS

JP 2004-127511 4/2004

* cited by examiner

*Primary Examiner*—Jay M Patidar
(74) *Attorney, Agent, or Firm*—Kratz, Quintos & Hanson, LLP

(57) ABSTRACT

The method of testing a magnetic head is capable of purely evaluating characteristics of the magnetic head without influences caused by external factors. The method of testing a magnetic head comprises the steps of: detecting amount of noises, which are included in output signals of a reading element of the magnetic head, a plurality of times in a state of reading no magnetic data; and comparing an amount of variation between the detected amounts of noises with a threshold value.

5 Claims, 1 Drawing Sheet

METHOD OF TESTING A MAGNETIC HEAD FOR ELIMINATING DEFECTIVE MAGNETIC HEADS

BACKGROUND OF THE INVENTION

The present invention relates to a method of testing a magnetic head for eliminating defective magnetic heads.

In a magnetic media apparatus e.g., magnetic disk drive unit, data are written in and read from a magnetic medium. To maintain reliability of the magnetic head, the magnetic head is tested before handling.

A conventional magnetic head tester is disclosed in Japanese Patent Gazette No. 2004-127511. In the patent gazette, test data are written in a recording medium by a magnetic head, the written date are reproduced by said magnetic head, and the magnetic head is evaluated on the basis of reproduced signals of the reproduced data.

In the conventional method, the test data are written in and read from the magnetic medium, and the good or bad of the magnetic head is evaluated on the basis of the reproduced signals. However, the reproduced signals are influenced by not only characteristics of the magnetic head but also characteristics of the magnetic medium and correlation between the magnetic medium and the magnetic head, e.g., a floating level of the magnetic head from a surface of a magnetic disk.

Therefore, it is difficult to purely evaluate the characteristics of the magnetic head only.

Especially, in a reading element of the magnetic head, a trouble of intermittently increasing and reducing amount of noises in the output signals, which is not caused by external factors, rarely occurs. To eliminate the defected magnetic head by the test, it is desirable to evaluate the magnetic head as a defected head if the amount of noises included in the output signals is increased and reduced from a threshold value at least once. However, the conventional method cannot judge if the amount of noises is varied by influence of the magnetic medium or by the trouble of the magnetic head.

SUMMARY OF THE INVENTION

The present invention was conceived to solve the above described problems.

An object of the present invention is to provide a method of testing a magnetic head, which is capable of purely evaluating characteristics of the magnetic head without influences caused by external factors.

Another object is to provide a method of testing a magnetic head, which is capable of easily eliminating the defected magnetic head, in which amount of noises included in output signals is intermittently increased and reduced.

To achieve the objects, the present invention has following structures.

Namely, the method of testing a magnetic head comprises the steps of: detecting amount of noises, which are included in output signals of a reading element of the magnetic head, a plurality of times in a state of reading no magnetic data; and comparing an amount of variation between the detected amounts of noises with a threshold value.

With this method, the amount of noises, which are included in the output signals of the reading element of the magnetic head, is detected a plurality of times in the state of reading no magnetic data, so characteristics of the magnetic head can be purely evaluated without being influenced by external factors. And, the magnetic head is evaluated on the basis of the amount of variation between the amounts of noises detected a plurality of times, so the defected magnetic head, in which amount of noises included in output signals is intermittently increased and reduced, can be easily eliminated.

In the method, the detecting step may include the sub-steps of: detecting envelope signals form the output signals; and measuring intensities of the envelope signals as the amounts of noises.

In this case, intermittent variation of the amount of noises can be suitably detected without detecting instantaneous variations of peaks of noises.

In the method, the amount of variation may be gained on the basis of a difference between a maximum value of the detected amounts of noises and an average value thereof or a minimum value thereof in the comparing step.

In this case, if the amount of noises increasing or reducing from the threshold value is detected at least once, the magnetic head can be evaluated as the defected magnetic head. Therefore, the defected magnetic head, whose reading element has the trouble of intermittently increasing and reducing the amount of noises, can be easily eliminated.

In the method, a the reading element may be a magnetoresistance effect element, and the detecting step may be performed in a state, in which bias voltage is applied to the magnetoresistance effect element.

By employing the method of the present invention, the characteristics of the magnetic head can be purely evaluated without being influenced by external factors. And, the defected magnetic head, in which the amount of noises included in the output signals is intermittently increased and reduced easily eliminating, can be suitably eliminated.

BRIEF DESCRIPTION OF THE DRAWINGS

Embodiments of the present invention will now be described by way of examples and with reference to the accompanying drawings, in which.

DETAILED DESCRIPTION OF THE EMBODIMENTS

Preferred embodiments of the present invention will now be described in detail with reference to the accompanying drawings.

In a method of the present embodiment, the good or bad of a magnetic head H, e.g., vertical magnetic head, is evaluated by detecting amount of noises included in output signals of a TMR element, which is a magnetoresistance effect element used as a reading element of the magnetic head H.

Figure 1:
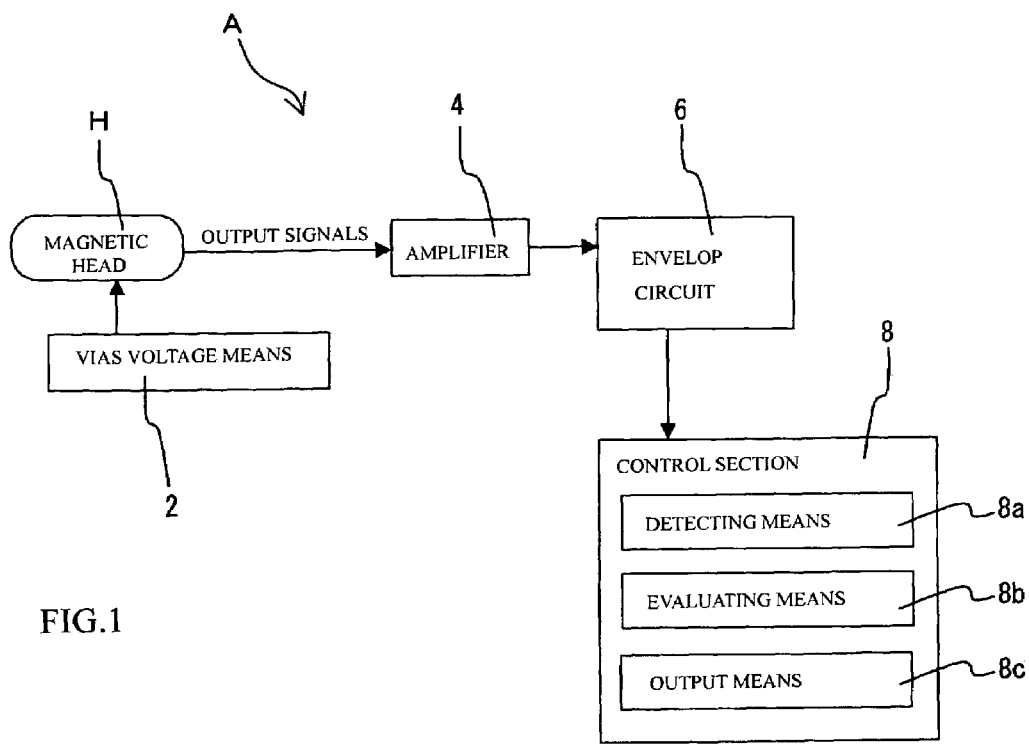
FIG. 1 is a block diagram of a magnetic head tester used in the method of the present invention.

FIG. 1 is a block diagram of a magnetic head tester A used in the method of the present embodiment. The magnetic head tester A comprises a bias voltage means 2, an amplifier 4, an envelop circuit 6 and a control section 8.

The bias voltage means 2 applies bias voltage, which is nearly equal to voltage applied to a magnetic medium, e.g., magnetic disk, for reading data, to the TMR element of the magnetic head H.

The amplifier 4 amplifies output signals of the TMR element, which are outputted via external terminals of the magnetic head H.

The envelop circuit 6 detects envelop signals included in the output signals amplified by the amplifier 4.

The control section 8 is a computer including a CPU, memories, etc. and acts as detecting means 8a, evaluating means 8b and outputting means 8c, which will be explained later, on the basis of programs.

Next, the method of testing the magnetic head of the present embodiment, which is performed by the magnetic head tester A, will be explained.

Firstly, a suspension, on which the magnetic head H is attached, is set in the magnetic head tester A. The biasing means 2 and the amplifier 4 are electrically connected to the TMR element of the magnetic head H via a cable circuit of the suspension and the external terminals of the magnetic head H.

The method is performed in a state, in which the magnetic head H reads no magnetic data from the magnetic medium.

Firstly, the bias voltage means 2 applies the bias voltage, which is nearly equal to the voltage applied to the magnetic medium for reading data, to the TMR element of the magnetic head H. With this step, a state of reading data from the magnetic medium is made without actually reading data by the magnetic head H.

Then, the output signals generated by the TMR element are amplified by the amplifier 4. Since the TMR element does not read the magnetic medium, the output signals are noise signals generated by the TMR element.

The envelop circuit 6 detects envelop signals included in the output signals amplified by the amplifier 4. The envelop signals are signals, whose waveforms are formed by connecting peaks of waveforms of the original output signals, i.e., the noise signals of the TMR element. Therefore, the envelop signals indicate variation of time-series intensities of the noises or amounts of noises generated by the TMR element.

The detecting means 8a of the control section 8 periodically reads the envelop signals, i.e., the amount of noises, a plurality of times and stores the detected amounts in the memory. This step is called a detecting step.

The evaluating means 8b reads the envelop signals, i.e., the amounts of noises, from the memory and compares an amount of variation between the detected amounts of noises with a prescribed threshold value. If the amount of variation is greater than the threshold value, the evaluating means 8b evaluates the magnetic head as a defected head. This step is called a comparing step or an evaluating step.

Preferably, in the evaluating step, the amount of variation is gained on the basis of a difference between a maximum value of the detected amounts of noises and an average value thereof or a minimum value thereof. For example, a difference between the maximum value and the minimum value of the amounts of noises or a difference between the maximum value and the average value of the amounts of noises may be used as the amount of variation of the magnetic head H. Further, a value gained by dividing a difference between the maximum value and the minimum value of the amounts of noises by the average value may be used as the amount of variation.

When the maximum value is "max", the minimum value is "min" and the average value is "ave", the evaluating means 8b of the present embodiment evaluates the magnetic head H as the good head if max/ave−min/ave<0.03; the evaluating means 8b evaluates the magnetic head H as the defected head if max/ave−min/ave≧0.03.

The outputting means 8c is constituted by, for example, a display unit or a printer and is capable of outputting the evaluation results evaluated by the evaluating means 8b, which evaluates that the magnetic head H is a good product or a bad product.

By employing the method of the present embodiment, characteristics of the magnetic head H can be purely evaluating without being influenced by external factors, e.g., conditions of the magnetic medium.

Further, a trouble of intermittently increasing and reducing the amount of noises in the output signals of the reading element (TMR element) of the magnetic head H can be easily detected. Results of experiments are shown in FIGS. 2 and 3.

When data were read from a magnetic medium by a defected magnetic head, which had the trouble of intermittently increasing and reducing the amount of noises in the output signals of the reading element (TMR element), error rate of reading errors was intermittently increased and reduced. FIG. 2 is a graph showing a relationship between number of times of rapidly increasing the error rate between adjacent sectors when a plurality of magnetic heads read contiguous sectors of a magnetic medium (the horizontal axis) and probability of evaluating as defected heads or number of times of evaluating as defected heads per 10 times by the method of the present embodiment (the vertical axis).

Figure 3:
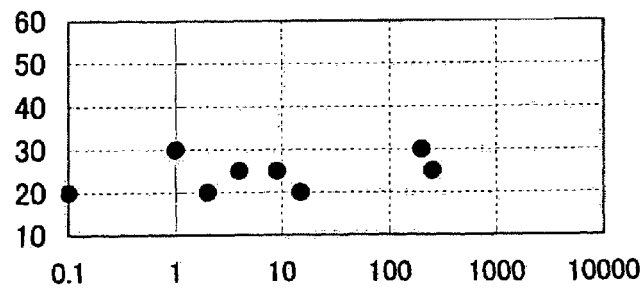
FIG. 3 is a graph showing a relationship between number of times of rapidly increasing error rate between adjacent sectors when a plurality of magnetic heads read contiguous sectors of a magnetic medium and probability of evaluating as defected magnetic heads by the conventional method.

FIG. 3 is a graph showing a relationship between number of times of rapidly increasing the error rate between the adjacent sectors (the horizontal axis) and probability of evaluating as defected magnetic heads or number of times of evaluating as defected heads per 10 times by the conventional method (the vertical axis).

Figure 2:
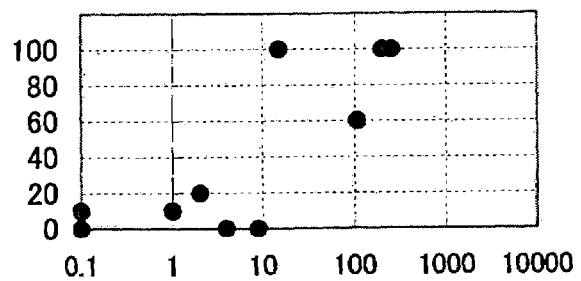
FIG. 2 is a graph showing a relationship between number of times of rapidly increasing error rate between adjacent sectors when a plurality of magnetic heads read contiguous sectors of a magnetic medium and probability of evaluating as defected heads by the method of the present invention.

According to the graphs of FIGS. 2 and 3, the defected magnetic heads, in each of which the number of times of rapidly increasing the error rate between the adjacent sectors is large, could be effectively eliminated by the method of the present embodiment. On the other hand, in the conventional method, the number of times of rapidly increasing the error rate did not correlate with evaluating as defected heads, so the defected heads, in each of which the number of times of rapidly increasing the error rate, could not be securely evaluated or eliminated.

By employing the method of the present embodiment, the amounts of noises of the magnetic head and the variation thereof can be easily evaluated without actually writing test data in and reading the test data from the magnetic medium and without being influenced by influences of the magnetic medium.

In the above described embodiment, the magnetic head is the vertical magnetic head having the TMR element, but the present invention is not limited to the above described embodiment. For example, the method may be applied to test a magnetic head having a GMR element, which is used for horizontal magnetic recording. In this case, the detecting step is performed in a state in which a sensing current is applied to the GMR element. With this step, the state of reading data from the magnetic medium is made without actually reading data.

The method of the present invention is not limited to the magnetic head for writing data in and reading data from a magnetic disk. For example, the method can be applied to test a magnetic head for writing data in and reading data from a magnetic tape.

The invention may be embodied in other specific forms without departing from the spirit of essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A method of testing a magnetic head, comprising the steps of:
   detecting amount of noises, which are included in output signals of a reading element of the magnetic head, while applying constant bias voltage to the magnetic head, reading no magnetic data and writing no magnetic data; and
   comparing an amount of variation between the detected amounts of noises with a threshold value.

2. The method according to claim 1, wherein said detecting step includes the sub-steps of:
   detecting envelope signals from the output signals; and
   measuring intensities of the envelope signals as the amounts of noises.

3. The method according to claim 1,
   wherein the amount of variation is gained on the basis of a difference between a maximum value of the detected amounts of noises and an average value thereof or a minimum value thereof in said comparing step.

4. The method according to claim 2,
   wherein the amount of variation is gained on the basis of a difference between a maximum value of the detected amounts of noises and an average value thereof or a minimum value thereof in said comparing step.

5. The method according to claim 1,
   wherein the reading element is a magnetoresistance effect element, and
   said detecting step is performed in a state, in which bias voltage is applied to the magnetoresistance effect element.

* * * * *